United States Patent
Matsumoto et al.

(10) Patent No.: US 12,117,475 B2
(45) Date of Patent: Oct. 15, 2024

(54) ELECTRIC FIELD SENSOR

(71) Applicants: Yokogawa Electric Corporation, Tokyo (JP); Hosei University, Tokyo (JP)

(72) Inventors: Yoshinori Matsumoto, Musashino (JP); Mitsuru Shinagawa, Tokyo (JP); Jun Katsuyama, Musashino (JP)

(73) Assignees: YOKOGAWA ELECTRIC CORPORATION, Tokyo (JP); Hosei University, Tokyo (JP)

( * ) Notice: Subject to any disclaimer, the term of this patent is extended or adjusted under 35 U.S.C. 154(b) by 625 days.

(21) Appl. No.: 17/424,194

(22) PCT Filed: Jan. 21, 2020

(86) PCT No.: PCT/JP2020/001833
§ 371 (c)(1),
(2) Date: Jul. 20, 2021

(87) PCT Pub. No.: WO2020/153322
PCT Pub. Date: Jul. 30, 2020

(65) Prior Publication Data
US 2022/0107349 A1    Apr. 7, 2022

(30) Foreign Application Priority Data
Jan. 22, 2019 (JP) ................. 2019-008252

(51) Int. Cl.
*G01R 29/14* (2006.01)
*G01R 15/24* (2006.01)
*G01R 29/08* (2006.01)

(52) U.S. Cl.
CPC ........... *G01R 29/14* (2013.01); *G01R 15/241* (2013.01); *G01R 29/0885* (2013.01)

(58) Field of Classification Search
CPC .. G01R 29/14; G01R 15/241; G01R 29/0885; G01R 15/242
(Continued)

(56) References Cited

U.S. PATENT DOCUMENTS

| 4,866,372 A | * | 9/1989 | Aoshima | ............... | G01R 15/242 |
| | | | | | 324/96 |
| 4,933,628 A | * | 6/1990 | Takahashi | ............ | G01R 15/242 |
| | | | | | 324/96 |

(Continued)

FOREIGN PATENT DOCUMENTS

| JP | 59-50370 A | 3/1984 |
| JP | 59-147272 A | 8/1984 |

(Continued)

OTHER PUBLICATIONS

Philipp O. Müller, et al., "New Calibration Method in Electrooptic Probing Due to Wavelength Control and Fabry-Perot Resonance", IEEE Transactions on Microwave Theory and Techniques, Mar. 1999, vol. 47, No. 3, pp. 308-314 (7 pages total).

*Primary Examiner* — Christopher P McAndrew
(74) *Attorney, Agent, or Firm* — Sughrue Mion, PLLC

(57) ABSTRACT

An electric field sensor includes a light source; an electro-optical crystal, a first separator, a first wavelength plate, first and second light receivers, a differential amplifier, and a controller. The electro-optical crystal has light from the light source incident thereon and receives an electric field generated by an object. The first separator separates light emitted from the electro-optical crystal into a P wave and an S wave. The first wavelength plate changes a phase of light at a pre-stage of the first separator. The first and second light receivers receive the P wave and S-wave light respectively, and convert the received light into first and second electrical signals, respectively. The differential amplifier generates a differential signal between the first and second electrical (Continued)

signals. The controller adjusts a wavelength of the light source such that an output value of a direct-current component of the differential amplifier is within a value range.

18 Claims, 9 Drawing Sheets

(58) Field of Classification Search
USPC .......................................................... 324/96
See application file for complete search history.

(56) References Cited

U.S. PATENT DOCUMENTS

| | | | | |
|---|---|---|---|---|
| 4,961,209 | A * | 10/1990 | Rowlands | G01R 29/24 |
| | | | | 378/33 |
| 5,053,693 | A * | 10/1991 | Bohnert | G01R 29/12 |
| | | | | 324/72 |
| 5,247,244 | A * | 9/1993 | Miller | G02F 1/0305 |
| | | | | 324/105 |
| 5,781,003 | A * | 7/1998 | Kondo | G01R 15/241 |
| | | | | 324/96 |
| 5,850,140 | A * | 12/1998 | Tokano | G01R 29/0885 |
| | | | | 324/96 |
| 5,963,034 | A * | 10/1999 | Mahapatra | G01R 29/0885 |
| | | | | 324/96 |
| 6,479,979 | B1 * | 11/2002 | Kingsley | G01R 15/241 |
| | | | | 324/96 |
| 6,512,385 | B1 * | 1/2003 | Pfaff | G01R 31/311 |
| | | | | 324/754.23 |
| 2003/0042884 | A1 | 3/2003 | Kingsley et al. | |
| 2004/0041083 | A1 * | 3/2004 | Kadogawa | G01R 15/241 |
| | | | | 250/214 R |
| 2004/0131301 | A1 * | 7/2004 | Liang | H01Q 7/00 |
| | | | | 385/12 |
| 2005/0200362 | A1 * | 9/2005 | Yakymyshyn | G01R 1/071 |
| | | | | 324/501 |
| 2005/0200371 | A1 | 9/2005 | Yakymyshyn et al. | |
| 2006/0152209 | A1 | 7/2006 | Sasaki et al. | |
| 2015/0185256 | A1 * | 7/2015 | Fujinoki | A61B 5/369 |
| | | | | 324/96 |

FOREIGN PATENT DOCUMENTS

| | | | | |
|---|---|---|---|---|
| JP | 59-147273 | A | | 8/1984 |
| JP | 63-144263 | A | | 6/1988 |
| JP | 02-030046 | A | | 1/1990 |
| JP | 05-034378 | A | | 2/1993 |
| JP | 06-230052 | A | | 8/1994 |
| JP | 07-055891 | A | | 3/1995 |
| JP | 2002-122622 | A | | 4/2002 |
| JP | 2003-204103 | A | | 7/2003 |
| JP | 2005-164555 | A | | 6/2005 |
| JP | 2007-101384 | A | | 4/2007 |
| JP | 4083718 | B2 | | 4/2008 |
| WO | WO-2009099090 | A1 * | 8/2009 | ......... G01R 29/0885 |

* cited by examiner

ELECTRIC FIELD SENSOR

TECHNICAL FIELD

The present invention relates to an electric field sensor.

This application is a National Stage of International Application No. PCT/JP2020/001833 filed Jan. 21, 2020, claiming priority based on Japanese Patent Application No. 2019-008252, filed Jan. 22, 2019, the contents of each of which is are herein incorporated by reference in their entireties.

BACKGROUND ART

As an electric field sensor that measures an electric field, an electric field sensor of which a sensor element is made of a metal as a general dipole antenna is generally used.

On the other hand, in electric field measurement using an electro-optical effect, since the sensor element is not made of a metal, it is possible to measure the electric field to be measured without being disturbed, and it is possible to perform measurement with high spatial resolution. Therefore, the electric field measurement using the electro-optical effect has begun to be used in various applications. The electro-optical effect is an effect in which, when an electric field is applied to an electro-optical crystal, a refractive index of light transmitted through the electro-optical crystal changes according to the intensity of the electric field. Further, the change in the refractive index gives a phase change to light waves passing through the optical crystal. In the electric field measurement using the electro-optical effect, it is possible to measure the electric field applied to the electro-optical crystal by measuring the change in phase (see, for example, Patent Literatures 1 and 2).

Here, a configuration example and an operation example of an electric field sensor using an electro-optical effect will be described.

FIG. 7 is a diagram showing a configuration example and an operation example of an electric field sensor 900 according to the related art, which uses an electro-optical effect. As shown in FIG. 7, the electric field sensor 900 includes a laser light source 901, an analyzer 902, a λ/4 wavelength plate 903, an electric field generation source 904, an electro-optical crystal 905, a λ/2 wavelength plate 906, a polarization beam splitter 907, a photodetector 908, a photodetector 909, and a differential amplifier 910.

The laser light source 901 is, for example, a semiconductor laser. The analyzer 902 emits linear polarization light among light rays incident from the laser light source 901. The λ/4 wavelength plate 903 polarizes the light rays incident from the analyzer 902 into circular polarization light and emits the light.

The electric field generation source 904 generates an electric field with respect to the electro-optical crystal 905. The electro-optical crystal 905 changes a polarization state by changing birefringence according to the intensity of the electric field applied by the electric field generation source 904. The electro-optical crystal 905 emits light rays of elliptical polarization light of which an orientation of an elliptical axis is tilted at 45 degrees. An ellipticity of the elliptical polarization light changes depending on the intensity of the electric field. The λ/2 wavelength plate 906 changes the light rays emitted by the electro-optical crystal 905 into elliptical polarization light in which the orientation of the elliptical polarization light is 0 degrees while maintaining the ellipticity of the elliptical polarization light.

The polarization beam splitter 907 separates the light rays of the elliptical polarization light of which the orientation is 0 degrees among the elliptical polarization light emitted by the λ/2 wavelength plate 906 into a P wave and an S wave. The photodetector 908 converts the P wave incident from the polarization beam splitter 907 into an electrical signal and outputs the converted electric signal of a P wave component to one input terminal of the differential amplifier 910. The photodetector 909 converts the S wave incident from the polarization beam splitter 907 into an electrical signal and outputs the converted electric signal of an S wave component to another input terminal of the differential amplifier 910.

The differential amplifier 910 amplifies a differential component between the electrical signals of the P wave component and the S wave component and outputs the amplified electrical signal to a signal processing device (not shown). Since the time change of the intensities of the P wave and the S wave causes opposite phases, an electric field intensity signal is doubled by the differential amplifier 910.

Here, assuming that the light intensity obtained after the light is transmitted through the analyzer 902 is $I_O$, the light intensity of the P wave is $I_P$, and the light intensity of the S wave is $I_S$, transmittance $T_P$ of the P wave is expressed by the following Equation (1) using a phase difference $\Gamma$. Further, transmittance $T_S$ of the S wave is expressed by the following Equation (2) using the phase difference $\Gamma$.

[Math. 1]

$$T_P = \frac{I_P}{I_O} = \frac{1}{2}[1 + \sin\Gamma] \tag{1}$$

[Math. 2]

$$T_S = \frac{I_S}{I_O} = \frac{1}{2}[1 - \sin\Gamma] \tag{2}$$

Here, in a case in which a voltage applied to the electro-optical crystal 905 is a sine wave and the phase difference $(\Gamma(t)=a\cdot\sin(2\pi ft))$ fluctuates with time, the transmittance $T_P(t)$ of the P wave is expressed as the following Equation (3). Further, the transmittance $T_S(t)$ of the S wave is expressed as the following Equation (4).

[Math. 3]

$$T_P(t) = \frac{I_P}{I_O} = \frac{1}{2}[1 + \sin\Gamma(t)] \tag{3}$$

[Math. 4]

$$T_S(t) = \frac{I_S}{I_O} = \frac{1}{2}[1 - \sin\Gamma(t)] \tag{4}$$

Here, in a case in which a differential balance between the transmittance $T_P(t)$ of the P wave and the transmittance $T_S(t)$ of the S wave matches a balance point, an average optical power $T_{PO}$ the P wave and an average optical power $T_{SO}$ of the S wave are equal, and thus the electric field sensor operates as shown in FIG. 8. FIG. 8 is a diagram for explaining an operation of a case in which the differential balance between the transmittance $T_P(t)$ of the P wave and the transmittance $T_S(t)$ of the S wave matches the balance point. In a graph indicated by reference sign g921 in FIG. 8, a horizontal axis is a phase difference F and the vertical axis is transmittance T. Further, reference sign g922 represents a change due to the P wave. Further, reference sign g923 represents a change due to the S wave. A graph of reference sign g924 represents changes in the light intensities of the P wave and the S wave at an average phase difference of 0. Reference sign g925 represents a change in the phase difference at an average phase difference of 0.

On the other hand, in a case in which laser light has an intensity fluctuation (a noise), ideally, waveforms of the transmittance $T_P(t)$ of the P wave and the transmittance $T_S(t)$ of the S wave are superimposed in a common phase, and thus the magnitudes of the noises are proportional to the average optical power $T_{PO}$ of the P wave and the average optical power $P_{SO} T_{SO}$ of the S wave. In a case in which the differential balance matches the balance point, $T_{PO}=T_{SO}$, and thus a noise component can be canceled by the differential amplifier 910.

However, practically, the phases deviate from each other as shown in FIG. 9 due to optical rotation and deviation of optical parts including the electro-optical crystal 905, angular deviation of the wavelength plate, and the like. FIG. 9 is a diagram for explaining an operation of a case in which the differential balance between the transmittance $T_P(t)$ of the P wave and the transmittance $T_S(t)$ of the S wave deviates from the balance point. In a graph indicated by reference sign g931 in FIG. 9, a horizontal axis is a phase difference $\Gamma$ and the vertical axis is transmittance T. Further, reference sign g932 represents a change due to the P wave. Further, reference sign g933 represents a change due to the S wave. A graph of reference sign g934 represents changes in the light intensities of the P wave and the S wave in which an offset $\Gamma_0$ is added to the phase difference. Reference sign g935 represents changes in the phase difference in which an offset $\Gamma_0$ is added to the phase difference.

In a case in which the differential balance deviates from the balance point, an offset $\Gamma_0$ occurs in the phase difference as in the following Equations (5) and (6), and the differential balance deviates from the balance point.

[Math. 5]
$$T_P(t) = \frac{I_P}{I_O} = \frac{1}{2}[1 + \sin\Gamma(t) + \Gamma_0] \quad (5)$$

[Math. 6]
$$T_S(t) = \frac{I_S}{I_O} = \frac{1}{2}[1 - \sin\Gamma(t) + \Gamma_0] \quad (6)$$

In a case in which the laser light has an intensity fluctuation (a noise), waveforms of the transmittance $T_P(t)$ of the P wave and the transmittance $T_S(t)$ of the S wave are superimposed in a common phase, and thus the magnitudes of the noises are proportional to the average powers $T_{PO}$ and $T_{SO}$ as described above. Here, in a case in which the differential balance deviates from the balance point, $T_{PO}$ and $T_{SO}$ are not equal, and the magnitudes of the noises are different. Therefore, the noise component cannot be canceled by the differential amplifier 910. Further, as shown in the graph of reference sign g934 in FIG. 9, when a value deviates from the balance point, the value is biased to a point where the modulation efficiency is small, and thus a signal component is reduced. In this way, when the balance between the P wave and the S wave is lost, S/N deteriorates.

Therefore, in the related art, in assembly adjustment, as shown in FIG. 10, the balance is adjusted by the wavelength plate being rotated. FIG. 10 is a diagram showing a configuration example in which the wavelength plate is rotated to adjust the differential balance. In FIG. 10, the same reference signs are used for parts having the same functions as those in FIG. 7, and the description thereof will be omitted.

As shown in FIG. 10, an electric field sensor 900a includes a laser light source 901, an analyzer 902, a λ/4 wavelength plate 903a, an electric field generation source 904, an electro-optical crystal 905, a λ/2 wavelength plate 906b, a polarization beam splitter 907, a photodetector 908, a photodetector 909, and a differential amplifier 910.

Also when an electric field is not applied to the electro-optical crystal 905, outputs of the photodetector 908 and the photodetector 909 are different from each other due to the deviation of the optical balance point, and the output of the differential amplifier 910 does not become zero. Therefore, in the electric field sensor 900a, the λ/4 wavelength plate 903a and the λ/2 wavelength plate 906b are rotated to optically adjust the balance between the P wave and the S wave.

CITATION LIST

Patent Literatures

[Patent Literature 1]
Japanese Unexamined Patent Application, First Publication No. 2002-122622
[Patent Literature 2]
Japanese Unexamined Patent Application, First Publication No. 2007-101384

SUMMARY OF INVENTION

Technical Problem

However, in a case in which the λ/4 wavelength plate 903a and the λ/2 wavelength plate 906b are rotated to optically adjust the balance between the P wave and the S wave as shown in FIG. 10, the fluctuation of the laser light can be removed, but the configuration may become complicated and the device may become large.

An aspect of the present invention has been made in view of the above circumstances, and an object of the present invention is to provide an electric field sensor capable of removing a fluctuation of laser light while simplifying a configuration as compared with the electric field sensor of the related art in an electric field sensor using an electro-optical effect.

Solution to Problem

To achieve the above-described object, an electric field sensor (electric field sensors 100, 100A, 100B, and 100C) according to one aspect of the present invention includes: a light source (a semiconductor laser 102); an electro-optical crystal (an electro-optical crystal 107) on which light in a predetermined polarization state based on light emitted by the light source is incident and which receives an electric field generated by an object; a first separator (a polarization beam splitter 109) that separates light emitted from the electro-optical crystal into a P wave and an S wave; a first wavelength plate (a λ/4 wavelength plate 105) that changes a phase of light at a pre-stage of the first separator; a first light receiver (a light receiving circuit 110) that receives the P wave light and converts the received light into a first electrical signal; a second light receiver (a light receiving circuit 111) that receives the S wave light and converts the received light into a second electrical signal; a differential amplifier (a differential amplifier 112) that generates a differential signal between the first electrical signal converted by the first light receiver and the second electrical signal converted by the second light receiver; and a controller (a DC level measurer 113, a temperature controller 114, and a temperature regulator 103) that adjusts a wavelength of the light source such that an output value of a direct-current component of the differential amplifier is within a predetermined value range in a state in which light is emitted from the light source and an electric field is applied to the electro-optical crystal.

With the above configuration, the electric field sensor changes the wavelength of the laser by adjusting the temperature of the light source such that the output of the differential amplifier is within a predetermined range. Thereby, according to the above configuration, a fluctuation (a noise) of a light intensity can be canceled by the laser. As a result, the balance deviation is reduced and the balance point is located at an appropriate position. Therefore, according to the above configuration, it is possible to perform stable electric field measurement in which a signal intensity is increased and S/N deteriorates less as compared with the case in which the balance deviates from the balance point. Further, in the above configuration, since the wavelength plate is not rotated, the device can be simplified and downsized as compared with the electric field sensor of the related art. Thereby, according to the above configuration, it is possible to remove a fluctuation of laser light by simplifying a configuration as compared with the electric field sensor of the related art without impairing measurement stability.

In the measurement device according to one aspect of the present invention, the controller may adjust a wavelength of the light source by adjusting a temperature of the light source such that an output value of a direct-current component of the differential amplifier is within the predetermined value range in a state in which light is emitted from the light source and an electric field is applied to the electro-optical crystal.

With the above configuration, in the electric field sensor, the controller adjusts a variation due to optical parts in a state in which the electric field is applied to the electro-optical crystal. Thereby, according to the above configuration, a fluctuation (a noise) of a light intensity can be further canceled by the laser. As a result, the balance deviation is reduced and the balance point is located at an appropriate position, and thus according to the above configuration, it is possible to perform stable electric field measurement in which a signal intensity is increased and S/N deteriorates less as compared with the case in which the balance deviates from the balance point.

In addition, the measurement device according to one aspect of the present invention may include: a transparent electrode (an ITO 116); and a mirror (a mirror 117), wherein, in the electro-optical crystal, the transparent electrode is disposed on one surface thereof to face each other, and the mirror is disposed on another surface thereof, and wherein light in a predetermined polarization state based on light emitted by the light source is incident from the transparent electrode, the light incident from the transparent electrode is reflected by the mirror, the reflected light is emitted from the transparent electrode, and the light emitted from the transparent electrode is incident on the separator.

With the above configuration, the electric field sensor can further cancel the fluctuation (the noise) of the light intensity by the laser even if the structure is a vertical structure. As a result, the balance deviation is reduced and the balance point is located at an appropriate position, and thus according to the above configuration, it is possible to perform stable electric field measurement in which a signal intensity is increased and S/N deteriorates less as compared with the case in which the balance deviates from the balance point.

The measurement device according to one aspect of the present invention may include: a first variable gainer (a variable gain amplifier 121) that changes a first gain of the first electrical signal of the first light receiver; and a second variable gainer (a variable gain amplifier 122) that changes a second gain of the second electrical signal of the second light receiver, wherein the controller may adjust the first gain of the first variable gainer and the second gain of the second variable gainer such that an output value of a direct-current component of the differential amplifier is within a predetermined value range in a state in which light is emitted from the light source and an electric field is not applied to the electro-optical crystal.

With the above configuration, in the electric field sensor, the first variable gainer and the second variable gainer adjust a variation due to the optical parts in a state in which the electric field is not applied to the electro-optical crystal, and the controller adjusts a variation due to the optical parts in a state in which the electric field is applied to the electro-optical crystal. Thereby, according to the above configuration, a fluctuation (a noise) of a light intensity can be further canceled by the laser. As a result, the balance deviation is reduced and the balance point is located at an appropriate position, and thus according to the above configuration, it is possible to perform stable electric field measurement in which a signal intensity is increased and S/N deteriorates less as compared with the case in which the balance deviates from the balance point.

In the electric field sensor (electric field sensors 100, 100A, 100B, and 100C) according to one aspect of the present invention, the electric field sensor may measure an electric field generated by the object using an electro-optical effect.

In addition, the first wavelength plate (the λ/4 wavelength plate 105) according to one aspect of the present invention may be disposed such that an orientation of an optical axis of the first wavelength plate is tilted by a first angle with respect to a predetermined axis.

In addition, the first wavelength plate (the λ/4 wavelength plate 105) according to one aspect of the present invention may be disposed at a pre-stage of the electro-optical crystal (the electro-optical crystal 107), wherein the electric field sensor (the electric field sensors 100, and 100B) may further include: a second wavelength plate (the λ/2 wavelength plate 108) which is disposed at a post-stage of the electro-optical crystal and changes a phase of light at a post-stage of the first separator.

In addition, the second wavelength plate (the λ/2 wavelength plate 108) according to one aspect of the present invention may be disposed such that an orientation of an optical axis of the second wavelength plate is tilted by a second angle with respect to the predetermined axis.

In addition, the light source (the laser light source 101) may include: a laser diode chip (a LD chip 102c) that emits light; a photodetector (a PD 102b) that measures a light intensity of the light emitted by the laser diode chip; a thermistor (a thermistor 102a) that measures a temperature of a substrate on which the laser diode chip and the photodetector are mounted; and a lens (a lens 102d) that collects light rays emitted by the laser diode chip.

In addition, the electric field sensor (the electric field sensors 100A, and 100C) according to one aspect of the present invention may further include: a second separator (a polarization beam splitter 115) disposed between the light source (the laser light source 101) and the one surface of the transparent electrode (ITO 116).

In addition, the controller (the DC level measurer 113, the temperature controller 114, and the temperature regulator 103) according to one aspect of the present invention may adjust the gain of the first variable gainer and the gain of the second variable gainer in real time.

In addition, the controller (the DC level measurer 113, the temperature controller 114, and the temperature regulator 103) according to one aspect of the present invention may adjust a wavelength of the light source by adjusting a temperature of the light source (the laser light source 101) using an output value of a direct-current component of the differential amplifier (the differential amplifier 112) and information output by the thermistor (the thermistor 102a) in a state in which light is emitted from the light source and an electric field is applied to the electro-optical crystal.

In addition, the light source (the laser light source 101) according to one aspect of the present invention may include: an external resonance type laser.

In addition, the electric field sensor (the electric field sensors 100B, and 100C) may further include: a first optical attenuator provided between the first separator and the first light receiver; and a second optical attenuator provided between the first separator and the second light receiver, wherein the controller (the DC level measurer 113, the temperature controller 114, and the temperature regulator 103)) may adjust an attenuation rate of each of the first optical attenuator and the second optical attenuator such that an output of the differential amplifier is within a predetermined range in a state in which the light source emits light and an electric field is not generated by an object.

Advantageous Effects of Invention

According to the aspect of the present invention, it is possible to remove a fluctuation of laser light by simplifying a configuration as compared with the electric field sensor of the related art.

DESCRIPTION OF EMBODIMENTS

Figure 1:
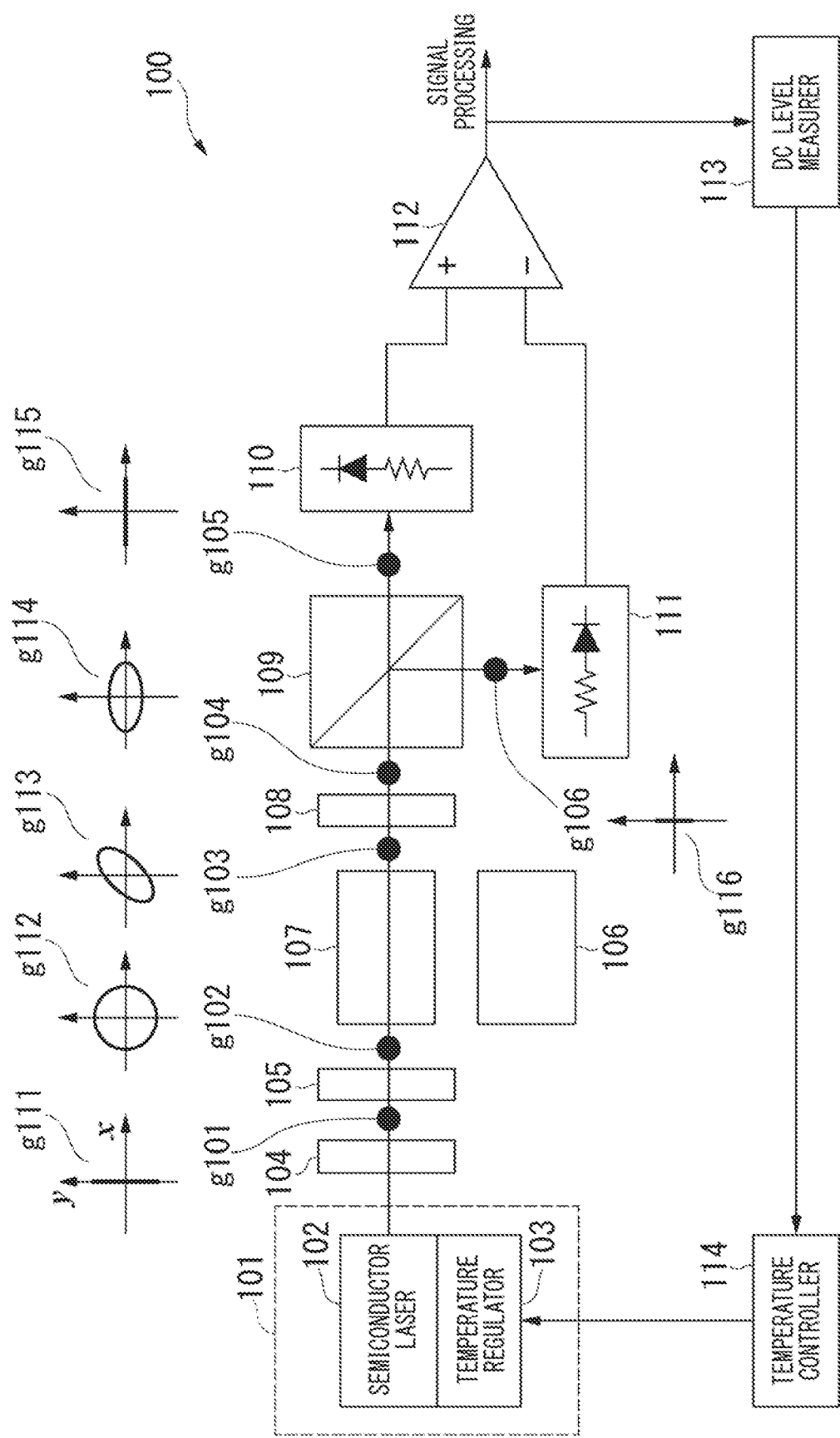
FIG. 1 is a diagram showing a configuration example of an electric field sensor according to a first embodiment.

Hereinafter, first to fourth embodiments of the present invention will be described with reference to the drawings. In the drawings used in the following description, the scale of each member is appropriately changed to make each member recognizable.

First Embodiment

FIG. 1 is a diagram showing a configuration example of an electric field sensor 100 according to a first embodiment. As shown in FIG. 1, the electric field sensor 100 includes a laser light source 101 (a light source), an analyzer 104, a λ/4 wavelength plate 105 (a first wavelength plate), an electric field generation source 106, an electro-optical crystal 107, a λ/2 wavelength plate 108 (a second wavelength plate), a polarization beam splitter 109 (a first separator), a light receiving circuit 110 (a first light receiver), a light receiving circuit 111 (a second light receiver), a differential amplifier 112 (a differential amplifier), a DC level measurer 113 (a controller), and a temperature controller 114 (a controller). Further, the laser light source 101 includes a semiconductor laser 102 (a light source) and a temperature regulator 103 (a controller). As shown by reference sign g111, in FIG. 1, light emitted from the laser light source 101 is a transverse wave having no vibration component in a traveling direction, and with respect to the traveling direction, a magnetic field vibration direction is set to an x-axis and an electric field vibration direction is set to a y-axis.

First, disposition of optical constituent elements of the electric field sensor 100 will be described.

The analyzer 104 is disposed between the laser light source 101 and the λ/4 wavelength plate 105. The λ/4 wavelength plate 105 is disposed between the analyzer 104 and the electro-optical crystal 107. The electro-optical crystal 107 is disposed between the λ/4 wavelength plate 105 and the λ/2 wavelength plate 108. The λ/2 wavelength plate 108 is disposed between the electro-optical crystal 107 and the polarization beam splitter 109. The polarization beam splitter 109 is disposed between the λ/2 wavelength plate 108 and the light receiving circuit 110, and between the λ/2 wavelength plate 108 and the light receiving circuit 111.

Next, a connection relationship of electrical constituent elements of the electric field sensor 100 will be described.

An output end of the light receiving circuit 110 is connected to a first input terminal of the differential amplifier 112. An output end of the light receiving circuit 111 is connected to a second input terminal of the differential amplifier 112. An output end of the differential amplifier 112 outputs a processed signal to a signal processing device (not shown).

Next, an operation of the electric field sensor 100 will be described.

The electric field sensor 100 obtains a phase change amount induced by an intensity of an electric field applied to the electro-optical crystal 107 mounted in the sensor by optical means. The electric field sensor 100 measures the magnitude of an electric field generated by an object to be measured by applying the electric field generated by the object to be measured to the electro-optical crystal 107 and measuring an output value of the differential amplifier 112 by the signal processing device (not shown).

The semiconductor laser 102 is, for example, a semiconductor laser. The semiconductor laser 102 is driven by a laser driver (not shown) to emit light.

The temperature regulator 103 is attached to the semiconductor laser 102. The temperature regulator 103 is, for example, a Peltier element. The temperature regulator 103 adjusts a temperature of the semiconductor laser 102 according to the control of the temperature controller 114.

The analyzer 104 emits linear polarization light (reference signs g101 and g111) among light rays incident from the laser light source 101.

The λ/4 wavelength plate 105 is disposed such that an orientation of an optical axis thereof is tilted by 45 degrees with respect to the x-axis. The λ/4 wavelength plate 105 polarizes the light rays incident from the analyzer 104 into circular polarization light (reference signs g102 and g112) and emits the light. In other words, the λ/4 wavelength plate 105 optically biases the light incident on the electro-optical crystal 107.

The electric field generation source 106 generates an electric field with respect to the electro-optical crystal 107.

The electro-optical crystal 107 changes a polarization state by changing birefringence according to the intensity of the electric field applied by the electric field generation source 106. The electro-optical crystal 107 emits light rays of elliptical polarization light (reference signs g103 and g113) of which an orientation of an elliptical axis is tilted at 45 degrees. An ellipticity of the elliptical polarization light changes depending on the intensity of the electric field. The electro-optical crystal 107 is, for example, $LiNbO_3$, $LiTaO_3$, $Bi_{12}SiO_{20}$ (BSO), $Bi_{12}GeO_{20}$ (BGO), ADP, KDP, or the like.

The λ/2 wavelength plate 108 is disposed such that an orientation of an optical axis thereof is tilted by 22.5 degrees with respect to the x-axis. The λ/2 wavelength plate 108 changes the light rays emitted by the electro-optical crystal 107 into elliptical polarization light (reference signs g104 and g114) in which the orientation of the elliptical polarization light is 0 degrees while maintaining the ellipticity of the elliptical polarization light.

The polarization beam splitter 109 separates the light rays of the elliptical polarization light of which the orientation is 0 degrees among the elliptical polarization light emitted by the λ/2 wavelength plate 108 into a P wave (reference signs g105 and g115) and an S wave (reference signs g106 and g116).

The light receiving circuit 110 has a photodetector. The light receiving circuit 110 converts the P wave incident from the polarization beam splitter 109 into an electrical signal and outputs the converted electric signal of a P wave component to the first input terminal of the differential amplifier 112.

The light receiving circuit 111 has a photodetector. The light receiving circuit 111 converts the S wave incident from the polarization beam splitter 109 into an electrical signal and outputs the converted electric signal of an S wave component to the second input terminal of the differential amplifier 112.

The differential amplifier 112 amplifies a differential component between the electrical signals of the P wave component and the S wave component and outputs the amplified electrical signal to the signal processing device (not shown).

The DC level measurer 113 measures a DC (direct current) level output by the differential amplifier 112 and outputs a value or information indicating the measured DC level to the temperature controller 114.

The temperature controller 114 acquires the value or information indicating the DC level output by the DC level measurer 113. The temperature controller 114 controls the temperature regulator 103 such that the value indicating the DC level is within a predetermined value range including 0 V.

In the first embodiment, a direct-current component is extracted from the output of the differential amplifier 112 by the DC level measurer 113, and the temperature of the semiconductor laser 102 is controlled by the temperature controller 114 and the temperature regulator 103 such that the extracted direct-current component is within a predetermined range including 0 V. The temperature controller 114 and the temperature regulator 103 adjust the temperature of the semiconductor laser 102 in real time.

Here, a relationship between an ambient temperature and an oscillation wavelength of the laser will be described.

Figure 2:
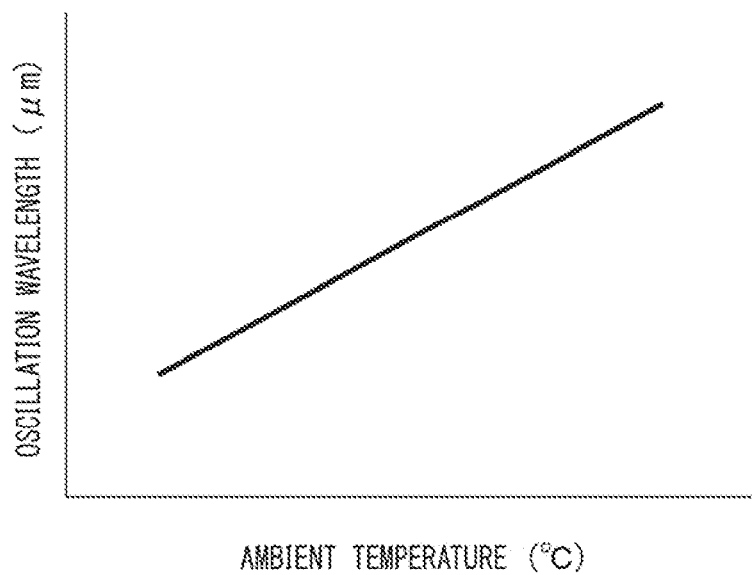
FIG. 2 is a diagram showing a relationship between an ambient temperature and an oscillation wavelength of a laser.

FIG. 2 is a diagram showing a relationship between an ambient temperature and an oscillation wavelength of the laser. A horizontal axis of FIG. 2 is a temperature (degrees), and a vertical axis is an oscillation wavelength (μm). As shown in FIG. 2, when the ambient temperature of the laser changes, the oscillation wavelength thereof also changes. For example, as the ambient temperature of the laser rises, the oscillation wavelength thereof increases.

Next, a configuration example of the laser light source 101 will be described.

Figure 3:
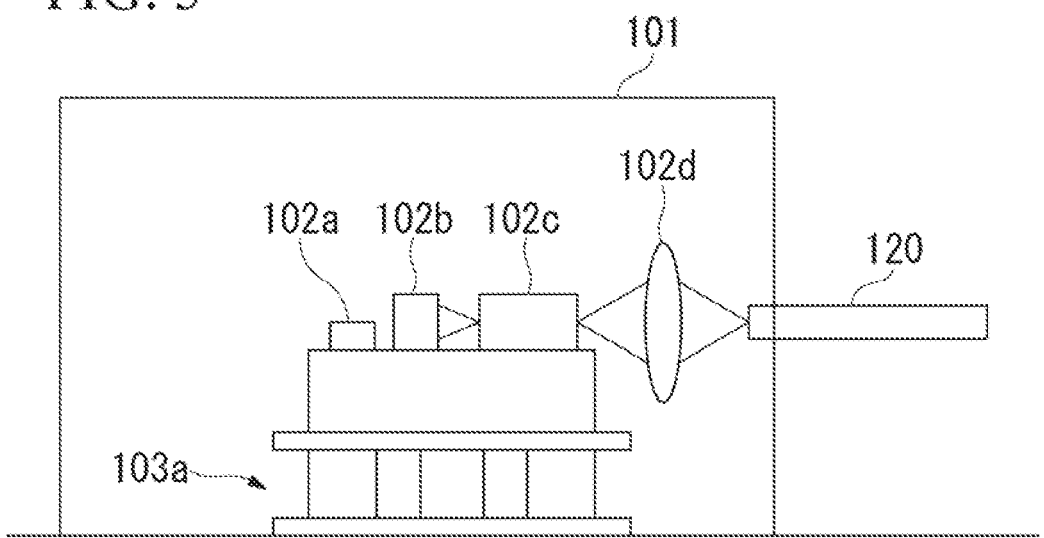
FIG. 3 is a diagram showing a configuration example of a laser light source according to the first embodiment.

FIG. 3 is a diagram showing a configuration example of the laser light source 101 according to the first embodiment. The laser light source 101 shown in FIG. 3 includes a thermistor 102*a*, a photodetector (PD) 102*b*, a laser diode (LD) chip 102*c*, a lens 102*d*, and a Peltier element 103*a*.

The thermistor 102*a* measures, for example, a temperature of a substrate on which the PD 102*b* and the LD chip 102*c* are mounted.

The PD 102*b* measures an intensity of the light emitted by the LD chip 102*c* and outputs the measured measurement value to the laser driver (not shown). The laser driver (not shown) controls the intensity of the light emitted by the LD chip 102*c* to a predetermined value based on the measurement value output by the PD 102*b*.

The LD chip 102*c* emits light according to the control of the laser driver (not shown).

The lens 102*d* collects the light rays emitted by the LD chip 102*c*. The lens 102*d* allows the collected light rays to be incident on an optical fiber 120.

In a structure shown in FIG. 3, the LD chip 102*c* is provided on the Peltier element 103*a*. With this configuration, it is possible to adjust the wavelength of the semiconductor laser 102 by adjusting the temperature of the LD chip 102*c*.

Here, a principle that allows a phase difference of the light rays propagating in the electro-optical crystal having birefringence to be changed by changing the wavelength of the laser will be described.

An optical phase difference Γ(?) after passing through the electro-optical crystal having birefringence is expressed by the following Equation (7).

[Math. 7]

$$\Gamma(\lambda) = \phi_f - \phi_s = \left(\frac{d}{\lambda_f} - \frac{d}{\lambda_s}\right) \quad (7)$$

$$= \left(\frac{f}{c_f} - \frac{f}{c_s}\right) \times d \times 360$$

$$= \left(\frac{1}{c_f} \times \frac{c}{\lambda} - \frac{1}{c_s} \times \frac{c}{\lambda}\right) \times d \times 360$$

$$= \left(\frac{c}{c_f} - \frac{c}{c_s}\right) \times \frac{d}{\lambda} \times 360$$

$$= \frac{\Delta n \times d \times 360}{\lambda}$$

In Equation (7), $\varphi_f$ is a phase of a fast axis. Further, $\varphi_s$ is a phase of a slow axis. Further, $\lambda_f$ is a wavelength of the fast axis. Further, $\lambda_s$ is a wavelength of the slow axis. c is a velocity of light in vacuum. Further, $c_f$ is a phase velocity of the fast axis. Further, $c_s$ is a phase velocity of the slow axis. $\lambda$ is a wavelength in vacuum. Further, f is a frequency in vacuum. d is a thickness of the electro-optical crystal. An is a refractive index difference between the fast axis and the slow axis. The fast axis is a vibration direction in which light propagates quickly in a crystal having birefringence. The slow axis is a vibration direction in which light propagates slowly in a crystal having birefringence.

As shown in Equation (7), when light having a wavelength of $\lambda$ and a frequency of f in vacuum propagates in an electro-optical crystal having birefringence and a thickness d, the phase difference $\Gamma(\lambda)$ between the light in the vibration direction of the fast axis and the light in the vibration direction of the slow axis is inversely proportional to the wavelength $\lambda$.

Here, a refractive index n is represented by the following Equation (8).

[Math. 8]

$$n = \frac{c}{c'} = \sqrt{\frac{\varepsilon \cdot \mu}{\varepsilon_0 \cdot \mu_0}} \quad (8)$$

In Equation (8), c' is a velocity of light in the electro-optical crystal. Further, $\varepsilon$ is a permittivity in vacuum. Further, $\varepsilon_0$ is a permittivity in the electro-optical crystal. Further, $\mu$ is a magnetic permeability in vacuum. Further, $\mu_0$ is a magnetic permeability in the electro-optical crystal.

From the Equation (7), the refractive index difference $\Delta n$ between the fast axis and the slow axis is as shown in the following Equation (9).

[Math. 9]

$$\Delta n = \left(\frac{c}{c_f} - \frac{c}{c_s}\right) \quad (9)$$

Figure 10:
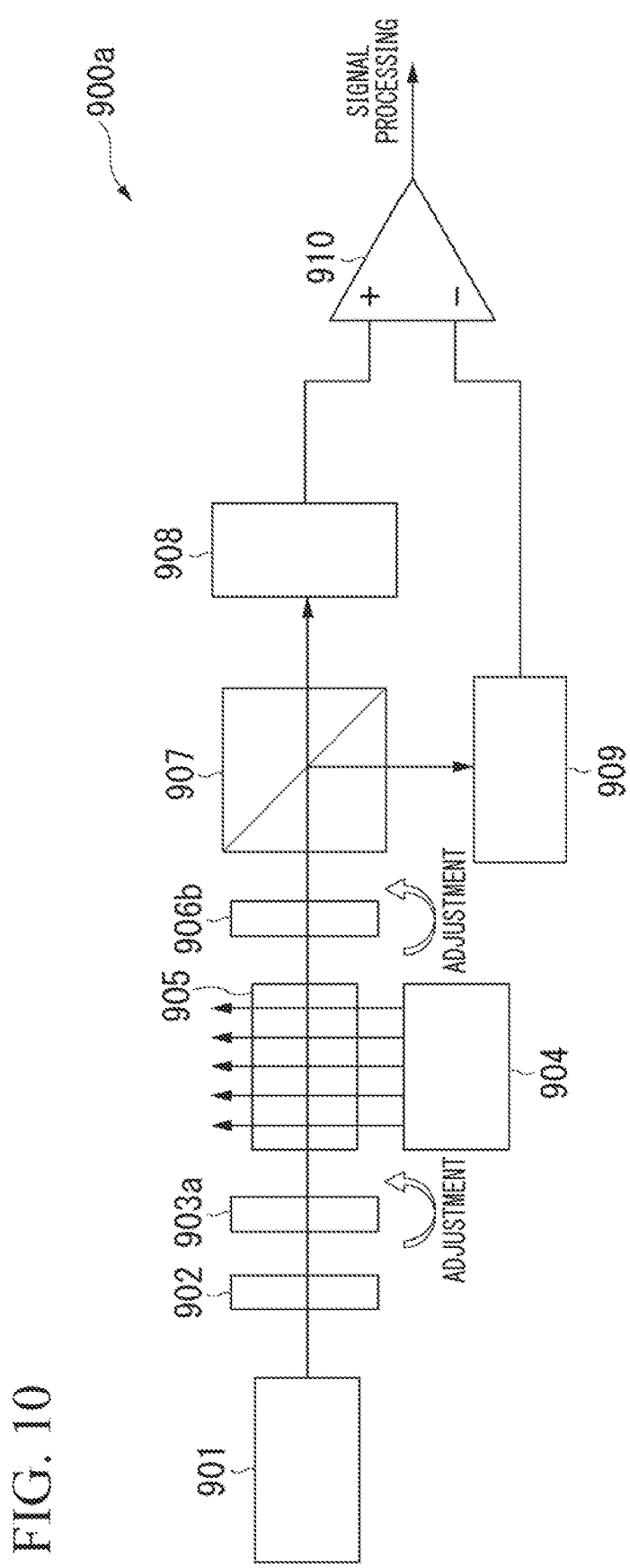
FIG. 10 is a diagram showing a configuration example in which a wavelength plate is rotated to adjust a differential balance.

As shown in Equation (9), it is possible to change the phase difference between the light in the vibration direction of the fast axis and the light in the vibration direction of the slow axis propagating in the electro-optical crystal having birefringence by changing the wavelength of the laser. Accordingly, the same effect as adjusting the optical balance by rotating the wavelength plate in the related art described with reference to FIG. 10 can be obtained.

Figure 8:
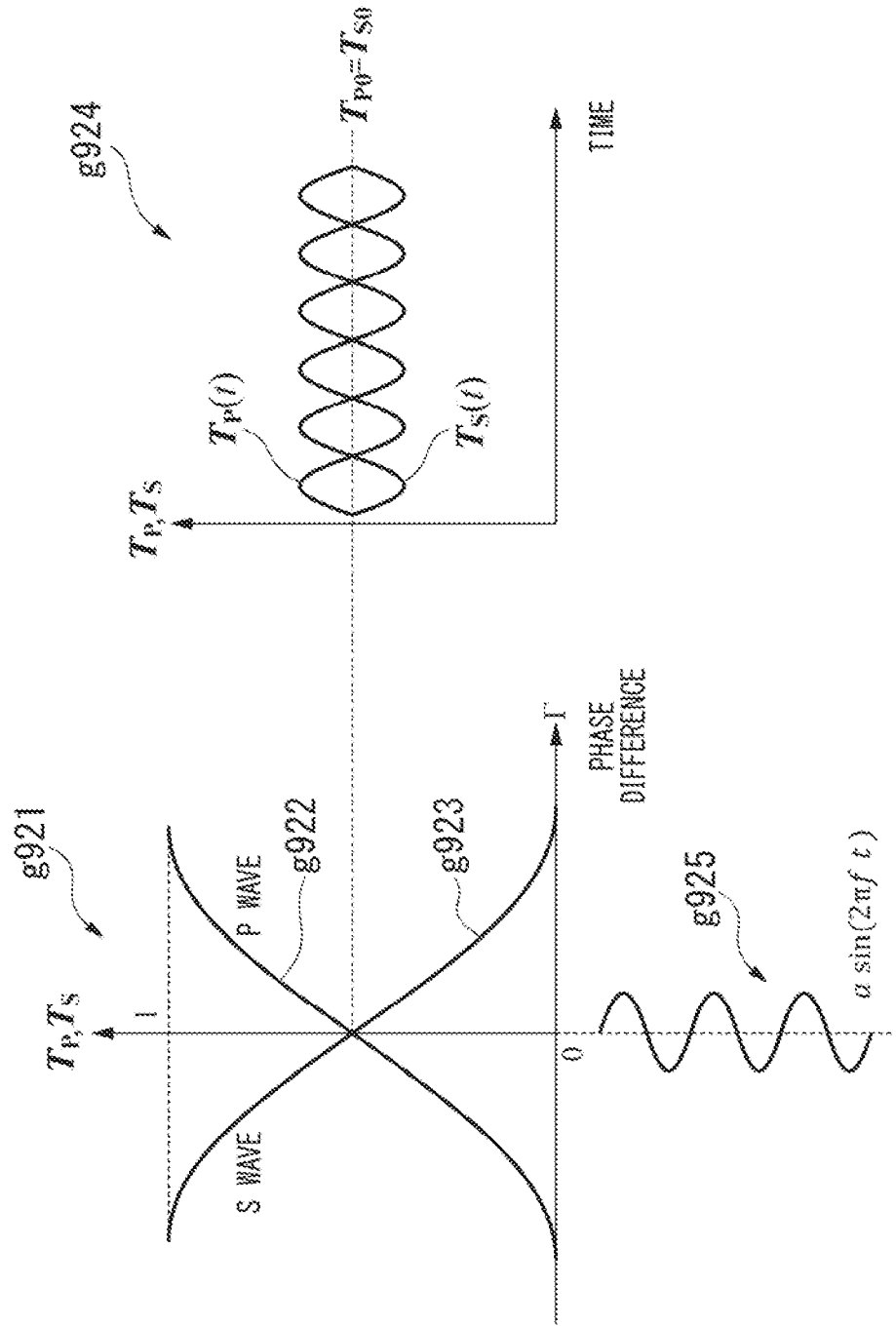
FIG. 8 is a diagram for explaining an operation of a case in which a differential balance between transmittance $T_P(t)$ of a P wave and transmittance $T_S(t)$ of an S wave matches a balance point.
Figure 9:
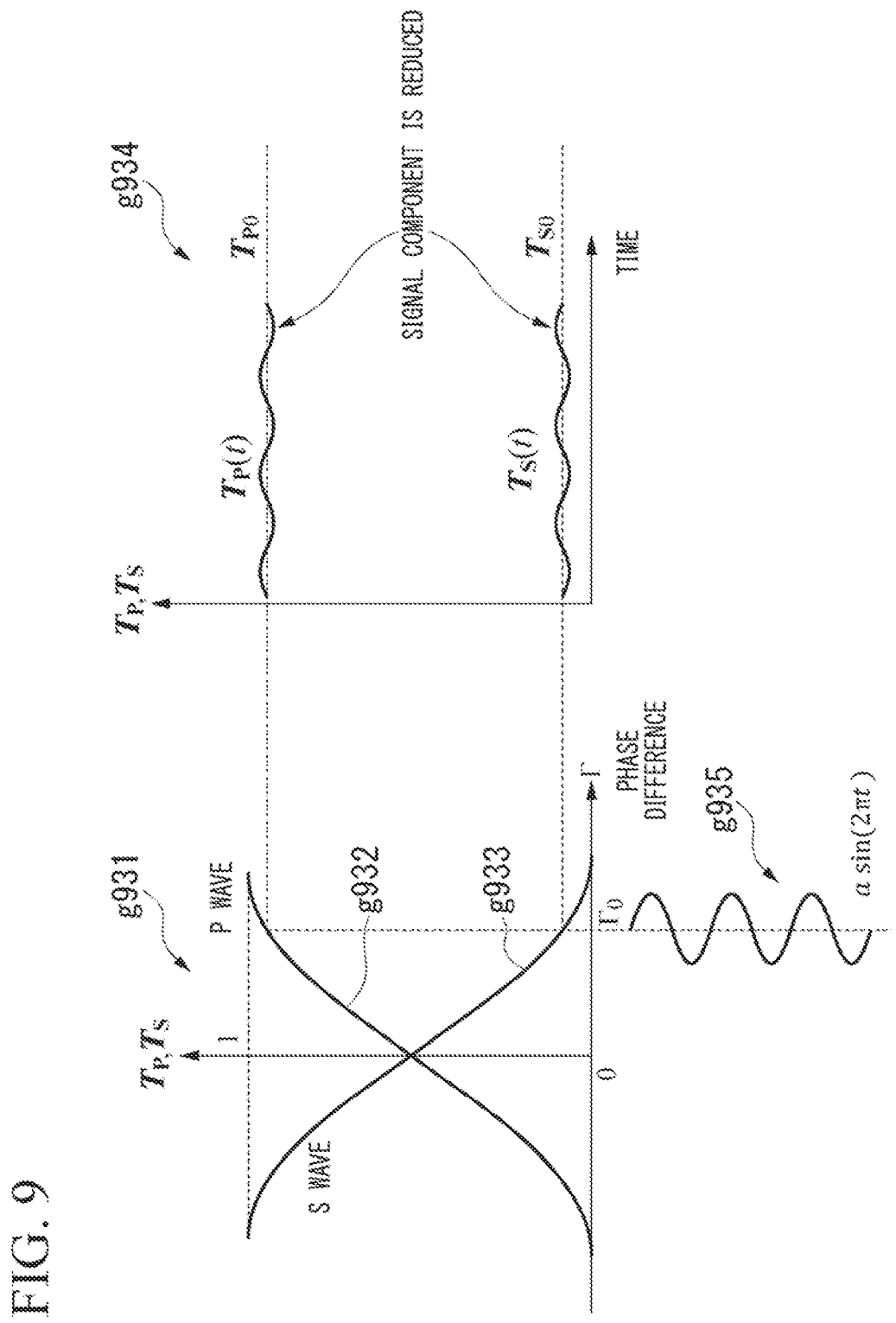
FIG. 9 is a diagram for explaining an operation of a case in which a differential balance between transmittance $T_P(t)$ of a P wave and transmittance $T_S(t)$ of an S wave deviates from a balance point.

As described above, due to the deviation of the optical balance point, a difference occurs between the outputs of the light receiving circuit 110 and the light receiving circuit 111, and a deviation voltage occurs in the output of the differential amplifier 112. In the first embodiment, also in such a case, the wavelength of the laser is changed with the temperature of the semiconductor laser 102 being adjusted such that the output of the differential amplifier 112 is in a predetermined range including 0 V. Thereby, according to the first embodiment, a fluctuation (a noise) of a light intensity can be canceled by the laser. As a result, the balance deviation is reduced and the balance point is located at an appropriate position, and thus, as described with reference to FIGS. 8 and 9, according to the first embodiment, it is possible to perform stable electric field measurement in which a signal intensity is increased and S/N deteriorates less as compared with the case in which the balance deviates from the balance point. Further, in the first embodiment, since the wavelength plate is not rotated, the device can be simplified and downsized as compared with the electric field sensor of the related art. Thereby, according to the first embodiment, it is possible to remove a fluctuation of laser light by simplifying a configuration as compared with the electric field sensor of the related art without impairing measurement stability.

Means for changing the wavelength of the laser is not limited to the above-mentioned means. The temperature controller 114 may change the wavelength of the semiconductor laser 102 using information output by the thermistor 102a shown in FIG. 3. Alternatively, an external resonance type laser may be used. In this case, a wavelength and an optical path length of the external resonance type laser may be controlled to be changed such that the direct-current component extracted from the differential amplifier 112 is within a predetermined range.

Second Embodiment

In a second embodiment, an example in which the electric field sensor has a vertical structure will be described.

Figure 4:
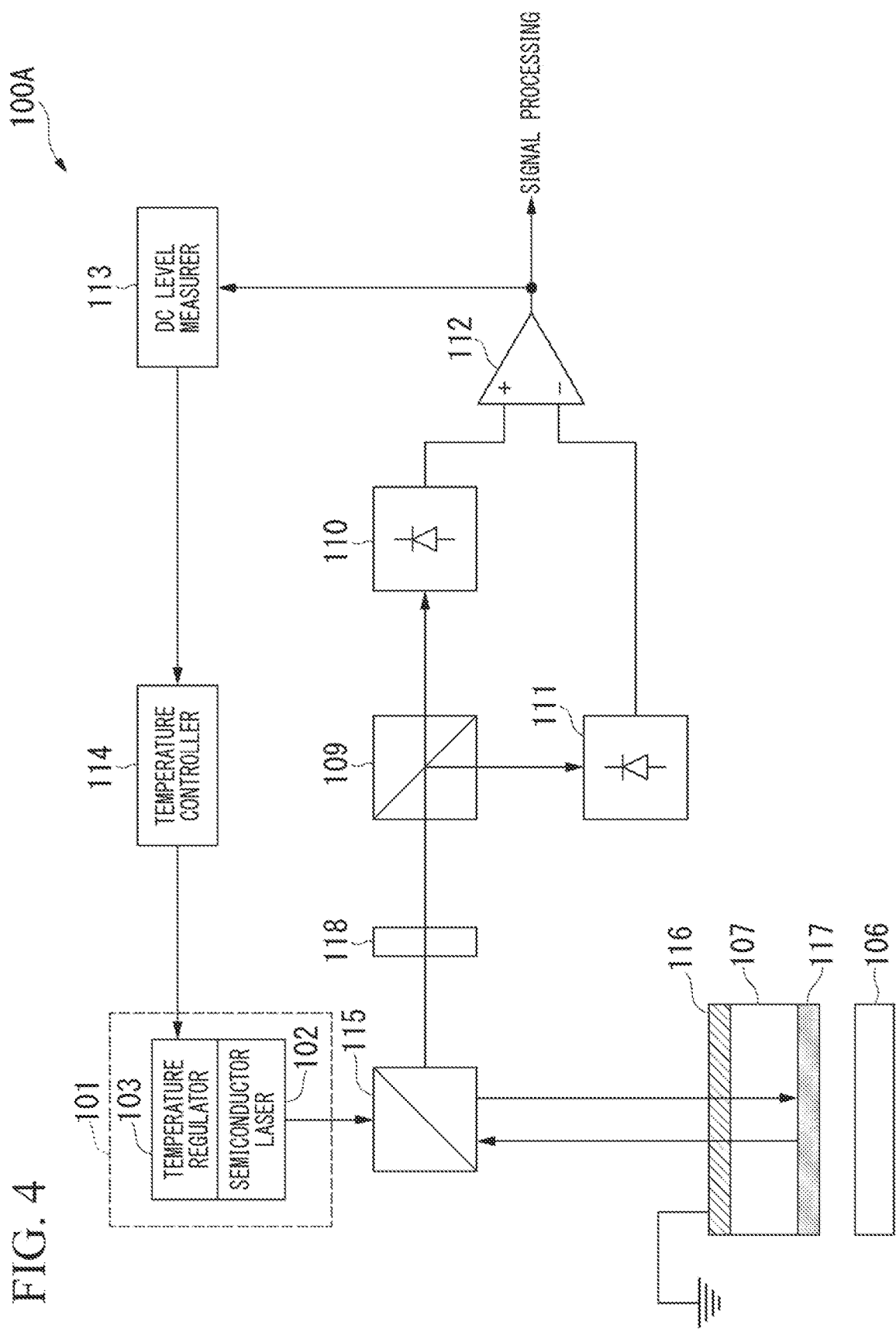
FIG. 4 is a diagram showing a configuration example of an electric field sensor according to a second embodiment.

FIG. 4 is a diagram showing a configuration example of an electric field sensor 100A according to the second embodiment. As shown in FIG. 4, the electric field sensor 100A includes a laser light source 101, an electric field generation source 106, an electro-optical crystal 107, a polarization beam splitter 109, a light receiving circuit 110, a light receiving circuit 111, a differential amplifier 112, a DC level measurer 113, a temperature controller 114, a polarization beam splitter 115 (a second separator), an indium tin oxide (ITO) 116, a mirror 117, and a $\lambda/4$ wavelength plate 118. Further, the laser light source 101 includes a semiconductor laser 102 and a temperature regulator 103. The same reference signs are used for constituent elements having the same functions as the electric field sensor 100 of the first embodiment, and the description thereof will be omitted.

First, disposition of optical constituent elements of the electric field sensor 100A will be described.

The polarization beam splitter 115 is disposed between the laser light source 101 and a first surface of the ITO 116. The $\lambda/4$ wavelength plate 118 is disposed between the polarization beam splitter 115 and the polarization beam splitter 109. The electro-optical crystal 107 is in contact with a second surface of the ITO 116 and a first surface of the mirror 117. The polarization beam splitter 109 is disposed between the $\lambda/4$ wavelength plate 118 and the light receiving circuit 110, and between the λ/4 wavelength plate 118 and the light receiving circuit 111.

Next, an operation of the electric field sensor 100A will be described.

The electric field sensor 100A obtains a phase change amount induced by an intensity of an electric field applied to the electro-optical crystal 107 mounted in the sensor by optical means. The electric field sensor 100A measures the magnitude of an electric field generated by an object to be measured by applying the electric field generated by the object to be measured to the electro-optical crystal 107 from the mirror 117 and measuring an output value of the differential amplifier 112 by the signal processing device (not shown).

Light rays emitted by the laser light source 101 passes through the polarization beam splitter 115, is incident on the ITO 116 with linear polarization light, passes through the electro-optical crystal 107, and is reflected by the mirror 117. The reflected light rays pass through the electro-optical crystal 107 and the ITO 116, become light rays of elliptical polarization light by the measured electric field, and are incident on the polarization beam splitter 115 again. The incident light rays are reflected by the polarization beam splitter 115, are incident on the λ/4 wavelength plate 118, are optically biased, and are incident on the polarization beam splitter 109. The polarization beam splitter 109 separates the light rays of the elliptical polarization light into a P wave and an S wave.

The ITO 116 is a transparent electrode and is grounded.

The first surface of the mirror 117 is a mirror surface.

The configuration shown in FIG. 4 is referred to as an electric field sensor having a vertical structure. Also in the electric field sensor having such a vertical structure, in a case in which there is a fluctuation (a noise) in light intensity due to the laser, the magnitude of the noise is proportional to an average power of the light. Therefore, in a case in which the phases deviate from each other due to deviation of constituent optical parts or angle deviation of the wavelength plate, a differential balance deviates from a balance point and the S/N deteriorates.

In the second embodiment, the output of the differential amplifier 112 is controlled to be within a predetermined range including 0 V as in the first embodiment, and thus the differential balance matches the balance point in real time. Accordingly, also in the second embodiment, the fluctuation (the noise) of the light intensity due to the laser can be canceled, and the signal intensity becomes larger than that in the case in which there is the noise, and thus it is possible to reduce the deterioration of the S/N as compared with the case in which there is the noise.

Means for changing the wavelength of the laser is not limited to the above-mentioned means. In the second embodiment, the temperature controller 114 may change the wavelength of the semiconductor laser 102 using information output by the thermistor 102a shown in FIG. 3. Alternatively, an external resonance type laser may be used. In this case, a wavelength and an optical path length of the external resonance type laser may be controlled to be changed such that the direct-current component extracted from the differential amplifier 112 is within a predetermined range.

Third Embodiment

The light of each of the P wave component and the S wave component separated by the polarization beam splitter is converted into an electrical signal by the photodetector of the light receiving circuit, but there may be a variation in a branching ratio of the polarization beam splitter and there may be a variation also in a light receiving sensitivity of the photodetector of each of the two light receiving circuits. Also in such a case, since the magnitude of a noise component due to the P wave and the magnitude of a noise component due to the S wave are different, the noise cannot be canceled by the differential amplifier 112.

With respect to such a noise, in a third embodiment, in a state in which optical bias is adjusted by the wavelength plate, the differential balance is electrically adjusted to be within a second predetermined range including 0 V using a variable gain amplifier provided in a post-stage of the light receiving circuit, and then the wavelength of the laser is further adjusted, and thus the differential balance is adjusted in real time.

Figure 5:
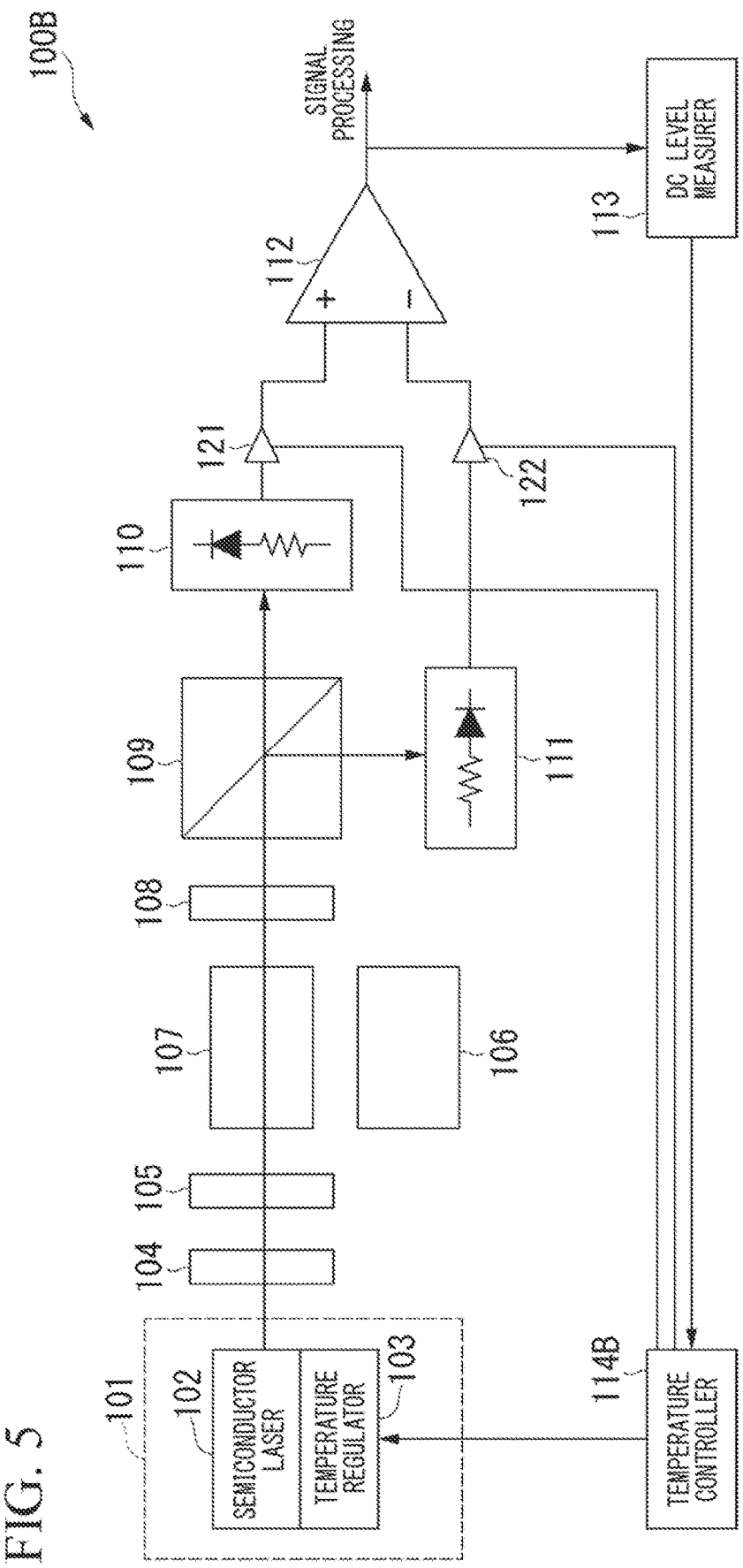
FIG. 5 is a diagram showing a configuration example of an electric field sensor according to a third embodiment.

FIG. 5 is a diagram showing a configuration example of an electric field sensor 100B according to the third embodiment.

As shown in FIG. 5, the electric field sensor 100B includes a laser light source 101, an analyzer 104, a λ/4 wavelength plate 105, an electric field generation source 106, an electro-optical crystal 107, a λ/2 wavelength plate 108, a polarization beam splitter 109, a light receiving circuit 110, a light receiving circuit 111, a differential amplifier 112, a DC level measurer 113, a temperature controller 114B, a variable gain amplifier 121, and a variable gain amplifier 122. Further, the laser light source 101 includes a semiconductor laser 102 and a temperature regulator 103. The same reference signs are used for constituent elements having the same functions as the electric field sensor 100 of the first embodiment, and the description thereof will be omitted.

Also in this configuration, the λ/4 wavelength plate 105 optically biases the light incident on the electro-optical crystal 107 as in the first embodiment.

Disposition of optical constituent elements of the electric field sensor 100B is the same as that of the electric field sensor 100. The electric field sensor 100B, as in the electric field sensor 100, measures the magnitude of an electric field generated by an object to be measured by applying the electric field generated by the object to be measured to the electro-optical crystal 107 and measuring an output value of the differential amplifier 112 by the signal processing device (not shown).

Next, a connection relationship of electrical constituent elements of the electric field sensor 100B will be described.

An output end of the light receiving circuit 110 is connected to an input terminal of the variable gain amplifier 121. An output terminal of the variable gain amplifier 121 is connected to a first input terminal of the differential amplifier 112. A control terminal of the variable gain amplifier 121 is connected to the temperature controller 114B.

An output end of the light receiving circuit 111 is connected to an input terminal of the variable gain amplifier 122. An output terminal of the variable gain amplifier 122 is connected to a second input terminal of the differential amplifier 112. A control terminal of the variable gain amplifier 122 is connected to the temperature controller 114B.

An output end of the differential amplifier 112 outputs a processed signal to a signal processing device (not shown).

The temperature controller 114B electrically adjusts the differential balance by adjusting a gain of each of the variable gain amplifier 121 and the variable gain amplifier 122 such that the output of the differential amplifier 112 is within the second predetermined range including 0 V in a state in which the laser light source 101 emits light and an electric field is not generated by the electric field generation source 106. After that, the temperature controller 114B, as in the first embodiment and the like, optically adjusts the differential balance by controlling the temperature regulator 103 such that the output of the differential amplifier 112 is within a predetermined range including 0 V in a state in which the laser light source 101 emits light and an electric field is generated by the electric field generation source 106.

As described above, according to the third embodiment, it is possible to adjust the differential balance even if there is a variation in the light receiving sensitivity of the photodetector of each of the two light receiving circuits. Accordingly, according to the third embodiment, the fluctuation (the noise) of the light intensity due to the laser can be canceled, and the signal intensity becomes larger than that in the case in which there is the noise, and thus it is possible to reduce the deterioration of the S/N as compared with the case in which there is the noise.

The adjustment of the differential balance that occurs in the light receiving circuit is not limited to the adjustment by the variable gain amplifier described above. A first optical attenuator (not shown) may be provided between the polarization beam splitter 109 and the light receiving circuit 110, and a second optical attenuator (not shown) may be provided between the polarization beam splitter 109 and the light receiving circuit 111.

In this case, the temperature controller 114B may optically adjust the differential balance by adjusting an attenuation rate of each of the first optical attenuator and the second optical attenuator such that the output of the differential amplifier 112 is within the second predetermined range including 0 V in a state in which the laser light source 101 emits light and an electric field is not generated by the electric field generation source 106.

Means for changing the wavelength of the laser is not limited to the above-mentioned means. In the third embodiment, the temperature controller 114B may change the wavelength of the semiconductor laser 102 using information output by the thermistor 102a shown in FIG. 3. Alternatively, an external resonance type laser may be used. In this case, a wavelength and an optical path length of the external resonance type laser may be controlled to be changed such that the direct-current component extracted from the differential amplifier 112 is within a predetermined range.

Fourth Embodiment

The variable gain amplifier described in the third embodiment also can be applied to the electric field sensor having a vertical structure described in the second embodiment.

Figure 6:
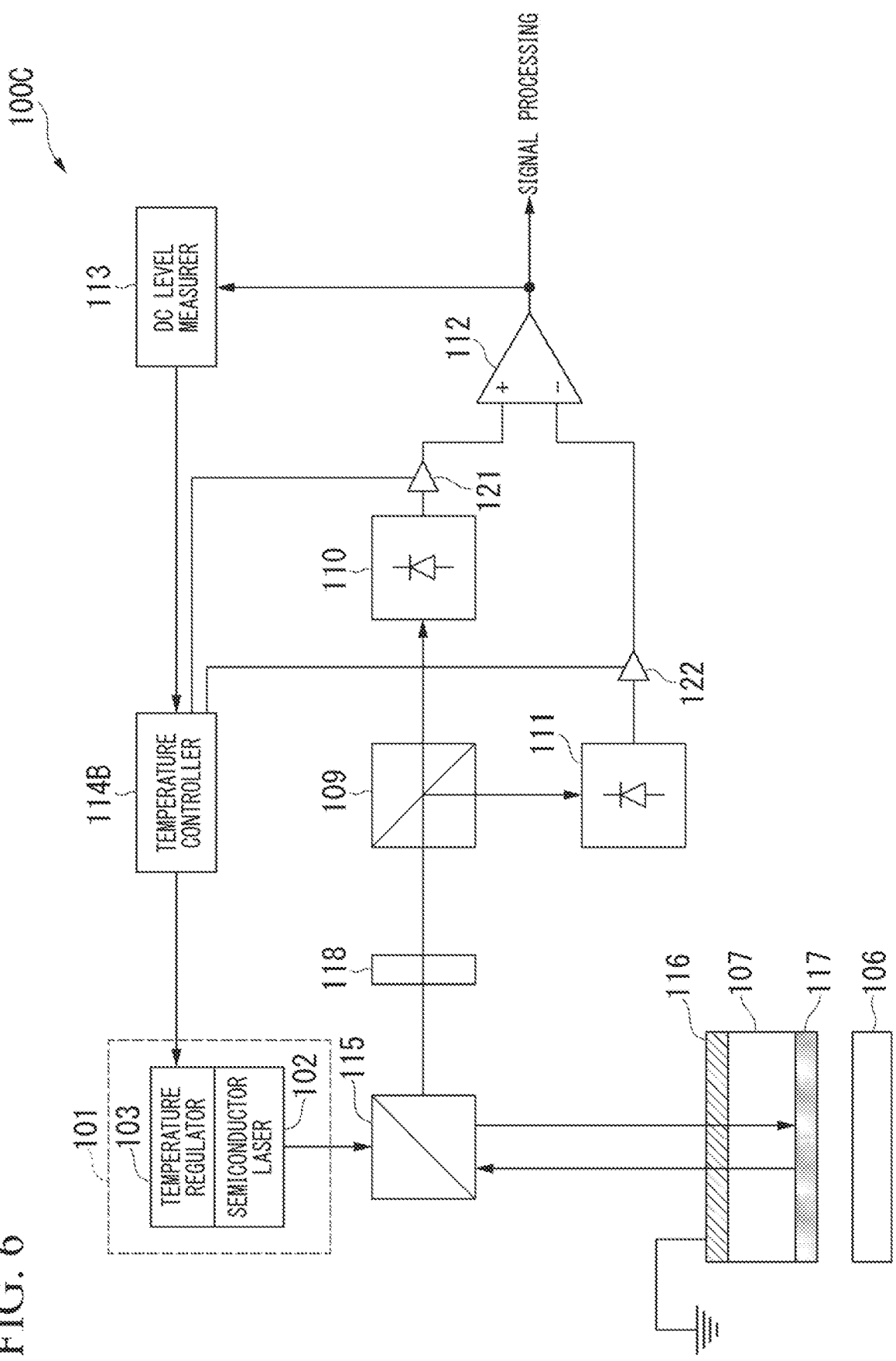
FIG. 6 is a diagram showing a configuration example of an electric field sensor according to a fourth embodiment.
Figure 7:
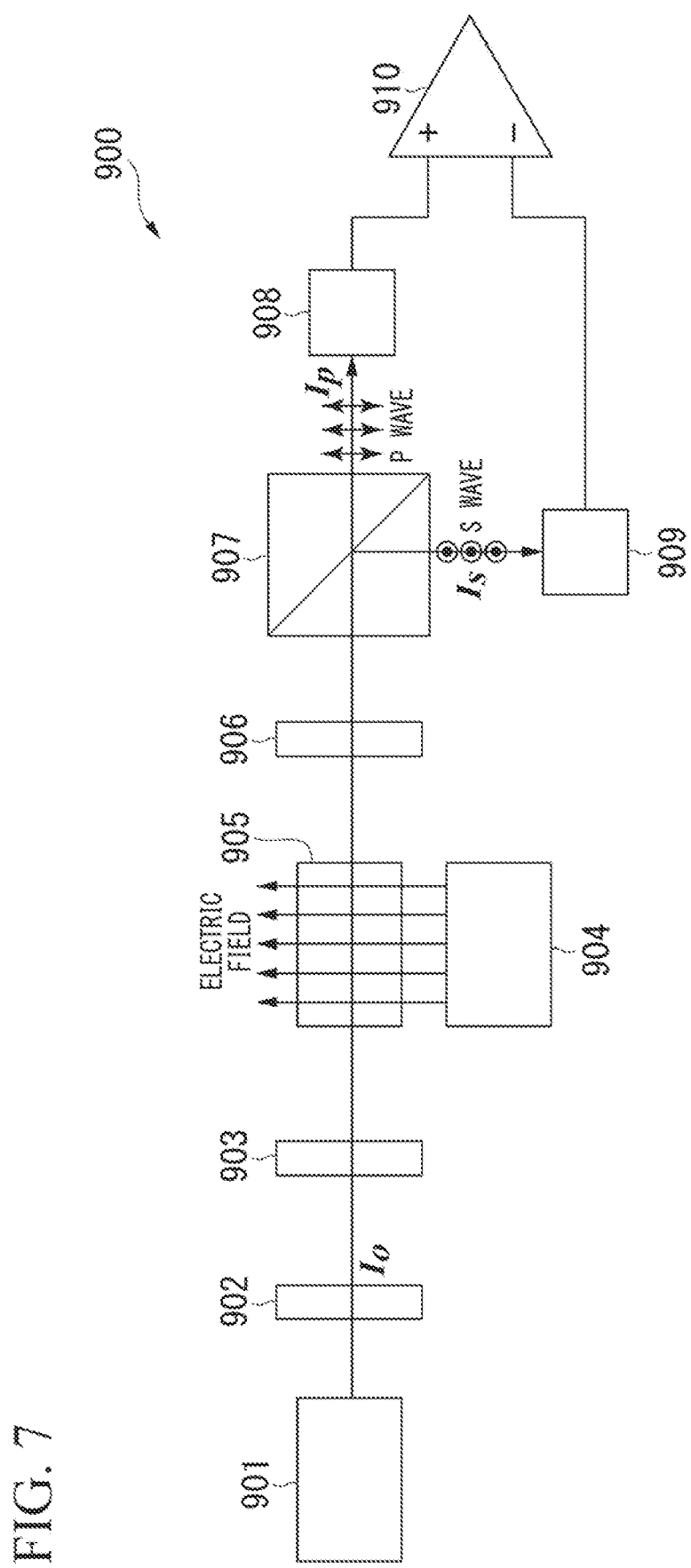
FIG. 7 is a diagram showing a configuration example and an operation example of an electric field sensor according to the related art, which uses an electro-optical effect.

FIG. 6 is a diagram showing a configuration example of an electric field sensor 100C according to a fourth embodiment. As shown in FIG. 6, the electric field sensor 100C includes a laser light source 101, an electric field generation source 106, an electro-optical crystal 107, a polarization beam splitter 109, a light receiving circuit 110, a light receiving circuit 111, a differential amplifier 112, a DC level measurer 113, a temperature controller 114B, a polarization beam splitter 115, an ITO 116, a mirror 117, a λ/4 wavelength plate 118, a variable gain amplifier 121, and variable gain amplifier 122. Further, the laser light source 101 includes a semiconductor laser 102 and a temperature regulator 103. The same reference signs are used for constituent elements having the same functions as the electric field sensor 100 of the first embodiment, the electric field sensor 100A of the second embodiment, and the electric field sensor 100B of the third embodiment, and the description thereof will be omitted.

Also in the fourth embodiment, the λ/4 wavelength plate 118 optically biases the light incident on the polarization beam splitter 115 as in the second embodiment.

The electric field sensor 100C, as in the electric field sensor 100A, measures the magnitude of an electric field generated by an object to be measured by applying the electric field generated by the object to be measured to the electro-optical crystal 107 from the mirror 117 and measuring an output value of the differential amplifier 112 by the signal processing device (not shown).

In the fourth embodiment, as in the third embodiment, the temperature controller 114B electrically adjusts the differential balance by adjusting a gain of each of the variable gain amplifier 121 and the variable gain amplifier 122 such that the output of the differential amplifier 112 is within the second predetermined range including 0 V in a state in which the laser light source 101 emits light and an electric field is not generated by the electric field generation source 106. After that, the temperature controller 114B optically adjusts the differential balance by controlling the temperature regulator 103 such that the output of the differential amplifier 112 is within a predetermined range including 0 V in a state in which the laser light source 101 emits light and an electric field is generated by the electric field generation source 106.

As described above, according to the fourth embodiment, it is possible to adjust the differential balance even if there is a variation in the light receiving sensitivity of the photodetector of each of the two light receiving circuits. Accordingly, according to the fourth embodiment, the fluctuation (the noise) of the light intensity due to the laser can be canceled, and the signal intensity becomes larger than that in the case in which there is the noise, and thus it is possible to reduce the deterioration of the S/N as compared with the case in which there is the noise.

Also in the fourth embodiment, the adjustment of the differential balance that occurs in the light receiving circuit is not limited to the adjustment by the variable gain amplifier described above. A first optical attenuator (not shown) may be provided between the polarization beam splitter 109 and the light receiving circuit 110, and a second optical attenuator (not shown) may be provided between the polarization beam splitter 109 and the light receiving circuit 111.

In this case, the temperature controller 114B may optically adjust the differential balance by adjusting an attenuation rate of each of the first optical attenuator and the second optical attenuator such that the output of the differential amplifier 112 is within the second predetermined range including 0 V in a state in which the laser light source 101 emits light and an electric field is not generated by the electric field generation source 106.

Means for changing the wavelength of the laser is not limited to the above-mentioned means. In the fourth embodiment, the temperature controller 114B may change the wavelength of the semiconductor laser 102 using information output by the thermistor 102a shown in FIG. 3. Alternatively, an external resonance type laser may be used. In this case, a wavelength and an optical path length of the external resonance type laser may be controlled to be changed such that the direct-current component extracted from the differential amplifier 112 is within a predetermined range.

Although the embodiments for carrying out the present invention have been described above using the first to fourth embodiments, the present invention is not limited to these embodiments and various modifications and replacement can be made in a range not departing from the gist of the present invention.

REFERENCE SIGNS LIST 100, 100A, 100B, 100C Electric field sensor
101 Laser light source
102 Semiconductor laser
103 Temperature regulator
104 Analyzer
105 λ/4 wavelength plate
106 Electric field generation source
107 Electro-optical crystal
108 λ/2 wavelength plate
109 Polarization beam splitter
110 Light receiving circuit
111 Light receiving circuit
112 Differential amplifier
113 DC level measurer
114, 114B Temperature controller
115 Polarization beam splitter
116 ITO
117 Mirror
118 λ/4 wavelength plate
121 Variable gain amplifier
122 Variable gain amplifier

The invention claimed is:

1. An electric field sensor comprising:
a light source;
an electro-optical crystal on which light in a predetermined polarization state based on light emitted by the light source is incident and which receives an electric field generated by an object;
a first separator that separates light emitted from the electro-optical crystal into a P wave and an S wave;
a first wavelength plate that changes a phase of light at a pre-stage of the first separator;
a first light receiver that receives the P wave light and converts the received light into a first electrical signal;
a second light receiver that receives the S wave light and converts the received light into a second electrical signal;
a differential amplifier that generates a differential signal between the first electrical signal converted by the first light receiver and the second electrical signal converted by the second light receiver;
a controller that adjusts a wavelength of the light source such that an output value of a direct-current component of the differential amplifier is within a predetermined value range in a state in which light is emitted from the light source and the electric field is applied to the electro-optical crystal;
a first variable gainer that changes a first gain of the first electrical signal of the first light receiver; and
a second variable gainer that changes a second gain of the second electrical signal of the second light receiver,
wherein the controller adjusts the first gain of the first variable gainer and the second gain of the second variable gainer such that the output value of the direct-current component of the differential amplifier is within the predetermined value range in a state in which light is emitted from the light source and the electric field is not applied to the electro-optical crystal.

2. The electric field sensor according to claim 1, wherein the controller adjusts the wavelength of the light source by adjusting a temperature of the light source such that the output value of the direct-current component of the differential amplifier is within the predetermined value range in the state in which light is emitted from the light source and the electric field is applied to the electro-optical crystal.

3. The electric field sensor according to claim 1, the electric field sensor further comprising:
a transparent electrode; and
a mirror,
wherein, in the electro-optical crystal, the transparent electrode is disposed on one surface thereof to face each other, and the mirror is disposed on another surface thereof, and
wherein light in the predetermined polarization state based on light emitted by the light source is incident from the transparent electrode, the light incident from the transparent electrode is reflected by the mirror, the reflected light is emitted from the transparent electrode, and the light emitted from the transparent electrode is incident on the first separator.

4. The electric field sensor according to claim 2, the electric field sensor further comprising:
a transparent electrode; and
a mirror,
wherein, in the electro-optical crystal, the transparent electrode is disposed on one surface thereof to face each other, and the mirror is disposed on another surface thereof, and
wherein light in the predetermined polarization state based on light emitted by the light source is incident from the transparent electrode, the light incident from the transparent electrode is reflected by the mirror, the reflected light is emitted from the transparent electrode, and the light emitted from the transparent electrode is incident on the first separator.

5. The electric field sensor according to claim 1, wherein the electric field sensor measures the electric field generated by the object using an electro-optical effect.

6. The electric field sensor according to claim 1, wherein the first wavelength plate is disposed such that an orientation of an optical axis of the first wavelength plate is tilted by a first angle with respect to a predetermined axis.

7. The electric field sensor according to claim 1,
wherein the first wavelength plate is disposed at a pre-stage of the electro-optical crystal, and
wherein the electric field sensor further comprises:
a second wavelength plate which is disposed at a post-stage of the electro-optical crystal and changes a phase of light at a post-stage of the first separator.

8. The electric field sensor according to claim 7, wherein the second wavelength plate is disposed such that an orientation of an optical axis of the second wavelength plate is tilted by a second angle with respect to a predetermined axis.

9. The electric field sensor according to claim 1,
wherein the light source comprises:
a laser diode chip that emits light;
a photodetector that measures a light intensity of the light emitted by the laser diode chip;
a thermistor that measures a temperature of a substrate on which the laser diode chip and the photodetector are mounted; and
a lens that collects light rays emitted by the laser diode chip.

10. The electric field sensor according to claim 3, the electric field sensor further comprising:

a second separator disposed between the light source and the one surface of the transparent electrode.

11. The electric field sensor according to claim 1, the electric field sensor further comprising:
a second separator disposed between the light source and one surface of a transparent electrode.

12. The electric field sensor according to claim 1, wherein the controller adjusts the first gain of the first variable gainer and the second gain of the second variable gainer in real time.

13. The electric field sensor according to claim 9, wherein the controller adjusts the wavelength of the light source by adjusting a temperature of the light source using the output value of the direct-current component of the differential amplifier and information output by the thermistor in the state in which light is emitted from the light source and the electric field is applied to the electro-optical crystal.

14. The electric field sensor according to claim 1, wherein the light source comprises:
an external resonance type laser.

15. The electric field sensor according to claim 3, the electric field sensor further comprising:
a first optical attenuator provided between the first separator and the first light receiver; and
a second optical attenuator provided between the first separator and the second light receiver,
wherein the controller adjusts an attenuation rate of each of the first optical attenuator and the second optical attenuator such that an output of the differential amplifier is within a predetermined range in a state in which the light source emits light and the electric field is not generated by the object.

16. The electric field sensor according to claim 1, the electric field sensor further comprising:
a first optical attenuator provided between the first separator and the first light receiver; and
a second optical attenuator provided between the first separator and the second light receiver,
wherein the controller adjusts an attenuation rate of each of the first optical attenuator and the second optical attenuator such that an output of the differential amplifier is within a predetermined range in a state in which the light source emits light and the electric field is not generated by the object.

17. An electric field sensor comprising:
a light source;
an electro-optical crystal on which light in a predetermined polarization state based on light emitted by the light source is incident and which receives an electric field generated by an object;
a first separator that separates light emitted from the electro-optical crystal into a P wave and an S wave;
a first wavelength plate that is disposed at a pre-stage of the electro-optical crystal and changes a phase of light at a pre-stage of the first separator;
a second wavelength plate that is disposed at a post-stage of the electro-optical crystal and changes a phase of light at a post-stage of the first separator;
a first light receiver that receives the P wave light and converts the received light into a first electrical signal;
a second light receiver that receives the S wave light and converts the received light into a second electrical signal;
a differential amplifier that generates a differential signal between the first electrical signal converted by the first light receiver and the second electrical signal converted by the second light receiver; and
a controller that adjusts a wavelength of the light source such that an output value of a direct-current component of the differential amplifier is within a predetermined value range in a state in which light is emitted from the light source and the electric field is applied to the electro-optical crystal.

18. An electric field sensor comprising:
a light source;
an electro-optical crystal on which light in a predetermined polarization state based on light emitted by the light source is incident and which receives an electric field generated by an object;
a separator that separates light emitted from the electro-optical crystal into a P wave and an S wave;
a first wavelength plate that changes a phase of light at a pre-stage of the first separator;
a first light receiver that receives the P wave light and converts the received light into a first electrical signal;
a second light receiver that receives the S wave light and converts the received light into a second electrical signal;
a differential amplifier that generates a differential signal between the first electrical signal converted by the first light receiver and the second electrical signal converted by the second light receiver;
a controller that adjusts a wavelength of the light source such that an output value of a direct-current component of the differential amplifier is within a predetermined value range in a state in which light is emitted from the light source and the electric field is applied to the electro-optical crystal;
a transparent electrode;
a mirror;
a first optical attenuator provided between the first separator and the first light receiver; and
a second optical attenuator provided between the first separator and the second light receiver,
wherein, in the electro-optical crystal, the transparent electrode is disposed on one surface thereof to face each other, and the mirror is disposed on another surface thereof,
wherein light in the predetermined polarization state based on light emitted by the light source is incident from the transparent electrode, the light incident from the transparent electrode is reflected by the mirror, the reflected light is emitted from the transparent electrode, and the light emitted from the transparent electrode is incident on the separator, and
wherein the controller adjusts an attenuation rate of each of the first optical attenuator and the second optical attenuator such that an output of the differential amplifier is within a predetermined range in a state in which the light source emits light and the electric field is not generated by the object.

* * * * *